United States Patent [19]

Smith et al.

[11] Patent Number: 4,947,361

[45] Date of Patent: Aug. 7, 1990

[54] NARROWBAND PARAMETER ESTIMATOR

[75] Inventors: Patrick J. Smith, Salt Lake City; Scott R. Bullock, West Jordan; Jeffery Mac Thornock, Layton, all of Utah

[73] Assignee: Unisys Corporation, Blue Bell, Pa.

[21] Appl. No.: 250,795

[22] Filed: Sep. 28, 1988

[51] Int. Cl.⁵ .............................................. G06F 15/31
[52] U.S. Cl. .................................. 364/724.09; 455/306
[58] Field of Search ................... 375/103, 99, 102; 364/724.07–724.09; 455/306, 307; 328/163, 165, 167, 240

[56] References Cited

U.S. PATENT DOCUMENTS

| | | | |
|---|---|---|---|
| 4,105,977 | 8/1978 | Fitting et al. | 328/163 |
| 4,177,430 | 12/1979 | Paul | 328/163 |
| 4,368,429 | 1/1983 | Jamison | 328/165 |
| 4,569,072 | 2/1986 | van Roermand | 455/307 |
| 4,627,079 | 12/1986 | von der Embse | 364/724.11 |
| 4,638,493 | 1/1987 | Bishop et al. | 375/99 |
| 4,649,505 | 3/1987 | Zinser, Jr. et al. | 375/103 |
| 4,731,587 | 3/1988 | Jensen | 328/167 |

Primary Examiner—Dale M. Shaw
Attorney, Agent, or Firm—Alfred W. Kozak; Robert S. Bramson

[57] ABSTRACT

A narrowband parameter estimator circuit is described which can be used to estimate the frequency and the relative power of narrowband interference tones which reside in a wideband information signal. A two-weight adaptive filter with a phase/frequency-lock loop circuit works in conjunction with a stepped synthesizer to lock onto the individual narrowband interference tones. A lock-detect circuit signals a digital logic unit to record the frequency of the stepped synthesizer and to measure the power in the adaptive filter output signal. This same output signal is used to cancel the unwanted tone in the wideband information signal being transmitted.

10 Claims, 6 Drawing Sheets

NARROWBAND PARAMETER ESTIMATOR

FIELD OF THE INVENTION

This disclosure involves techniques in the field of wideband signal transmission where tones or narrowband signals which corrupt the desired wideband signal are detected and eliminated from the received signal.

BACKGROUND OF THE INVENTION

In the fields of wideband signal transmission and data communications, it is possible that reception of the transmitted signal will be disrupted due to the presence of an unwanted tone or other narrowband interference source. For example, a slowly changing amplitude or frequency modulated carrier is a possible source of narrowband interference.

Various systems have been devised to eliminate, or to diminish, the effect of these interference sources. In particular, with the use of what are called single tone cancellers and adaptive line enhancers, the reduction of certain types of interference has been effectuated.

In cases where a desired wideband signal is corrupted by the presence of one or more interfering tones, such as may often occur in a communication system, an adaptive line enhancer (ALE) could be utilized. These devices are effectively adaptive noise cancellers which actually create their own reference signal, rather than rely on a supplied reference signal. An ALE can handle multiple tone interference. A single tone canceller can handle one tone.

As will be shown, a single tone canceller requires a noise-free "reference" tone which is phase related to the single tone interference frequency which is disturbing the transmission.

The reference tone required by single tone adaptive noise cancellers may be generated with a synthesizer circuit as long as the frequency of the interference source is precisely known ahead of time.

However, in many situations where single tone interference is a problem, the frequency is not known beforehand, or additionally, the frequency of the interference signal may be varying slowly with time. Under these conditions, the use of a synthesizer becomes an impractical application.

In the adaptive line enhancer, the creation of its own reference signal is accomplished by "delaying" a copy of the input signal to "decorrelate" the wideband component and then to filter this delayed signal with a transversal filter. This transversal filter attenuates the wideband component while adjusting the phase and amplitude of the narrowband component to match that of the narrowband interference (NBI) which is contained in the input signal.

This matched narrowband signal is then subtracted from the entire wideband input signal, thus cancelling the narrowband interference.

It might be noted, however, that transversal digital filters are extremely expensive, and in the case where there is only a single tone interferer, they would be considered unnecessary.

A much more effective and efficient embodiment is provided herein which involves the use of a phase-locked loop (PLL) to generate the required reference tone.

The situation occurs where wideband signals of interest are corrupted by the presence of single tone interference signals. A solution is provided by a system in which a circuit regenerates the single tone interference which then is used to exactly cancel the original single tone interference from the wideband input signal, and thus leave the desired interference-free wideband signal.

In the past, when a clean reference of the single tone interference was available, adaptive single tone cancellers have been used. These single tone cancellers were limited in their usefulness according to the availability of a "clean", or noise-free, reference signal.

In the present disclosure, a phase-locked loop (or a frequency-locked loop) is used to generate this "clean" reference signal. Thus, the previous limitation of requiring a clean reference signal is no longer necessary since the phase/frequency-locked loop provides the clean reference for the single tone adaptive noise canceller.

As stated, the single tone canceller requires a clean reference tone. This clean reference tone is provided by the phase/frequency-lock loop. But the phase and amplitude of this reference tone must be adjusted before cancellation of the interference can be achieved.

This adjustment is accomplished by the two-weight adaptive noise canceller, just as is done when a reference tone is provided. The procedure involved in adjusting the phase and amplitude is "adaptive" and therefore requires feedback.

One very widely used adaptation algorithm is the LMS (least mean square) algorithm. Certain implementations of this algorithm introduce time delays into the feedback loop, and these time delays must be compensated for.

In the prior art, as seen in FIG. 3, analog (or digital) transversal adaptive filters were used, whereby the wideband signal plus the interference signal $I_s$ was fed into the point A. This led to an analog (or digital) decorrelation delay and thence to a tapped delay line which handled, typically, 16 tap points. The adaptive line enhancer shown in FIG. 3 functions specifically by using the LMS algorithm.

Every single one of the 16 taps has an output line which was fed into a multiplier; e.g., $M_P$ and thence to an integrator $I_P$. The output of integrator $I_P$ is referred to as a "filter weight", and multiplies the same tap value. Each tap has a corresponding weight which "weights" the tap value at multiplier $M_2$. In each case for each of the 16 taps, the output of $M_2$ was fed to a summer $S_P$ where the regenerated narrowband interferer appears. The output of this summer was fed on line B to a subtracter circuit $ST_P$ which also received the initial input from line A. After convergence, the narrowband interference is nulled out at the subtracter circuit $ST_P$, leaving the wideband signal on output line $L_o$ clean and clear of the interference signal $I_S$.

The multiplier $M_P$ additionally received a feedback of the output from $L_o$ along line C. The process of multiplying this feedback signal by the tap signal at multiplier $M_P$, and then integrating with integrator $I_P$, provides the filter weights. (LMS algorithm)

However, this type of system involved multitudes of components,—for example, two multipliers and one integrator per tap. Thus, for 16 taps, this came to $3 \times 16 = 48$ units plus 16 input summer circuits, plus 16 tapped delay line elements plus a decorrelation delay unit. The present embodiment shown in FIG. 1 reduces, in great measure, the number of components involved to four multipliers, two integrators, two summer circuits, a phase shifter and a phase/frequency-lock loop.

A need for extending the utility of the single tone canceller to very high frequency bands arose.

Digital implementations of the two-weight adaptive noise canceller are desirable because of the precision and predictability provided by currently available digital circuitry. However, the operating band of digital filters is restricted to baseband, in particular from DC to one-half the clock frequency of the digital circuitry (Nyquist's theorem).

If it is desired to filter a frequency band which lies outside this baseband range, then an analog/digital implementation (FIGS. 4, 5, 6) may be considered. Here, the two-weight adaptive filter (of FIG. 2) is digital but the phase/frequency-lock loop is analog.

SUMMARY OF THE INVENTION

A single tone interference canceller is provided which is driven by a phase/frequency-lock loop to generate a reference tone. This reference tone is then used by circuitry which eliminates the interfering frequency from a wideband signal transmission of information.

Since the digital implementation of the single tone canceller is restricted to baseband frequency range, high frequency band transmissions must be translated to baseband so that the interference canceller can cancel unwanted tones.

The high frequency wideband input signal is thus translated to baseband for use by the two-weight adaptive filter. The adaptive filter output is then translated up to the input signal band where the interfering tone is cancelled.

The problem arises of finding a particular band which contains a narrowband interference tone, and then using this information to eliminate the interference tone.

In this regard, a stepped synthesizer is used to scan portions of the high frequency signal band by translating successive portions of that band to baseband. When the phase-frequency-lock loop locks onto a tone, a lock detector senses the lock, and signals a digital logic unit.

The digital logic unit controls the band-stepping via the synthesizer, and also receives information from a power detect circuit as to the power level of the unwanted narrowband interference. After "lock" has been detected, a period of time is allowed for the adaptive filter to converge. The filter output power level is then measured.

By estimating the frequency and power of the various interfering tones, some optimum means of eliminating these signals may be employed. This may involve the use of channelizers, ALE's, or other single tone cancellers.

The circuitry described herein provides a phase/frequency-lock loop which locks onto a single tone interference frequency which resides in the disturbance area of a desired wideband signal. A voltage controlled oscillator (VCO) in the phase/frequency-lock loop provides an output tone which is the noise-free reference signal required by the single tone canceller.

Additionally, if the frequency of the interfering signal or signals is not known beforehand, then a frequency-locked loop may be used in place of the phase-locked loop. Thus reference is made herein to the circuitry as the phase/frequency-lock loop.

The circuit embodiment herein can be described as a single tone canceller driven by a phase-lock loop. It is made up of (a) a two-weight digital adaptive filter, and (b) a phase-locked loop. But equally useful is a frequency-lock loop which may be used in combination with the phase-lock loop since the frequency-lock loop would be used in combination with the phase-lock loop. Assuming an operating condition where a wideband input has a single tone interference frequency within it, the phase-locked loop locks onto the single-tone interferer. The VCO (voltage controlled oscillator) then provides the reference tone for the two-weight adaptive filter.

The in-phase and the quadrature versions of the VCO tone are periodically sampled in order to provide the filter tap values for the two-weight digital adaptive filter.

The output of the adaptive filter is generated by multiplying the tap values by their corresponding current weight values and summing the resultant products.

Then this output signal is subtracted from the input signal in order to form an error signal which is then utilized by the weight update algorithm. This algorithm may be the LMS (least mean square) algorithm or any other weight update method.

The output signal from the adaptive filter is the phase and amplitude adjusted tone which is then used to cancel (subtract) the interfering tone embedded in the wideband signal. After convergence, the output tone (which is also the error signal) is the desired wideband signal free of the corrupting interference.

"Convergence" is meant to indicate that point in time when the output signal from the adaptive filter most closely approximates the interfering tone.

BRIEF DESCRIPTION OF THE PREFERRED EMBODIMENT

Figure 2:
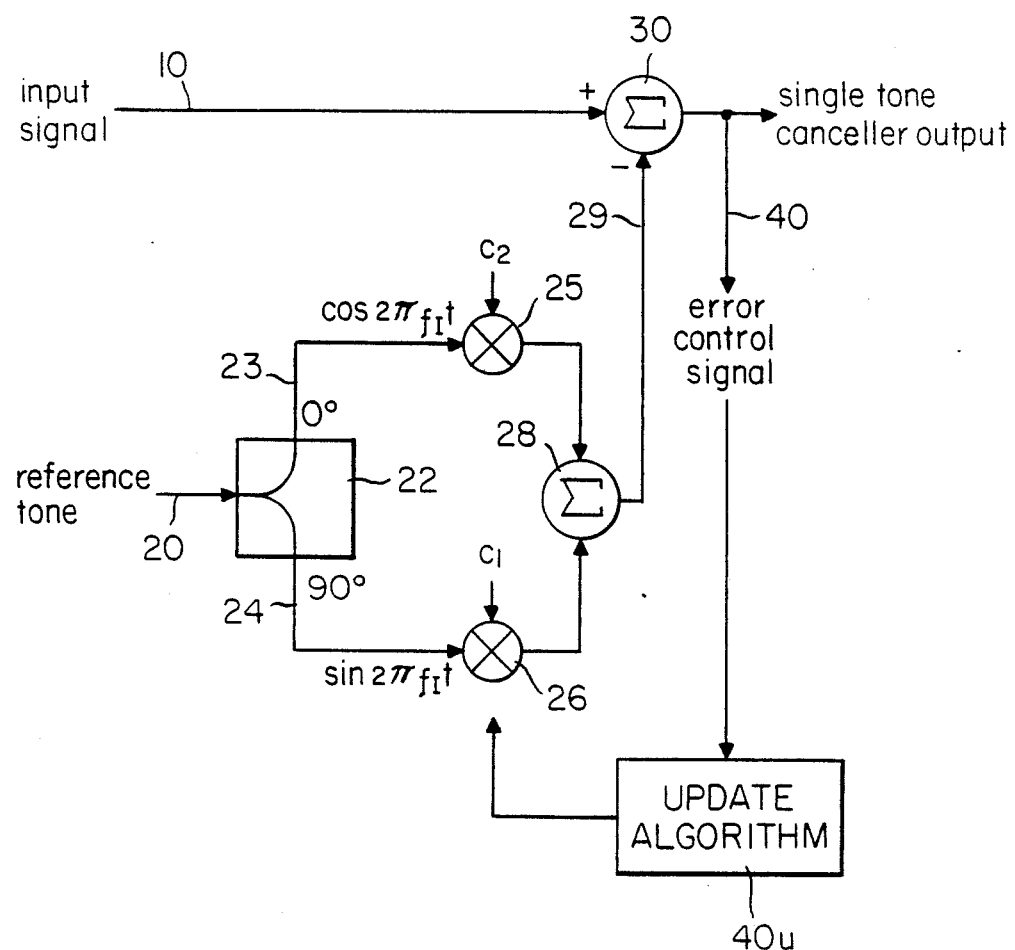
FIG. 2 is a drawing of the circuit for a single tone adaptive noise canceller which is dependent on obtaining a suitable reference tone for effective operation.

The use of a noise canceller as seen in FIG. 2 shows that a single tone adaptive noise canceller can consist of a two-weight ($c_2$ and $c_1$) adaptive filter which weights and sums the in-phase and the quadrature versions of the noise-free reference tone.

The phase and amplitude of the reference tone 20 is, in this fashion, adjusted to match the phase and the amplitude of the single tone interference which is embedded within the desired wideband signal. This filtered reference tone is subtracted from the wideband input signal 10, thus cancelling, or nulling, the single tone interference. If the phases and the amplitudes are perfectly matched (convergence), then the corrupting single tone interference will be exactly cancelled by this operation. These basics of a single tone adaptive noise canceller may be seen in FIG. 2. These involve the use of the input signal 10 and the reference tone 20. The reference tone 20 is fed into a quadrature power divider 22 which gives the in-phase tone on line 23 and the quadrature tone on line 24. The two tones are weighted ($c_2$ and $c_1$) by the multipliers 25 and 26 respectively.

Thus the reference tone on line 23 and the 90° phase shifted or quadrature reference tone on line 24 are seen to be weighted by the filter coefficients $c_2$ and $c_1$, and are summed by summer 28 to produce an output signal on line 29. This output signal is then fed to the final output summer 30.

The summation of the weighted in-phase and the weighted quadrature tones at 28 is fed through line 29 to the final output summer 30, which combines the input signal 10 and the output signal 29 of summer 28. At this juncture, summed signal on line 29 is subtracted from the input signal 10 at the output summer 30 in order to produce an error control signal 40. This error control signal is fed to an update algorithm circuit $40_u$ which is used to adjust the weights $c_2$ and $c_1$. Upon convergence of the two-weight adaptive noise canceller, the error signal becomes the interference-free wideband signal.

The error signal 40 can be specifically utilized by an algorithm such as the LMS (least mean square) weight update algorithm.

Regarding the LMS algorithm, let the input signal $d(t)$ be represented by $d(t) = A \cos(2\pi f t - \phi) + w(t)$. where A is the amplitude and $\phi$ the phase of the single tone interference, and $w(t)$ represents the wideband signal.

Further, let the two-weight canceller output, $y(t)$ be represented by $y(t) = c_1 \cos(2\pi f t) + c_2 \sin(2\pi f t)$; where $\cos(2\pi f t)$ represents the VCO (voltage controlled oscillator) tone.

Then the error signal $e(t)$ is represented by $e(t) = d(t) - y(t) = A \cos(2\pi f t - \phi) - c_1 \cos(2\pi f t) - c_2 \sin(2\pi f t) + w(t)$.

The LMS algorithm estimates the gradient of the mean of $e^2(t)$ which is usually written as $<e^2(t)>$ with respect to each weight. Thus, (i) (gradient of $<e^2(t)>$ with respect to $$c_1) \simeq \frac{\partial e^2(t)}{\partial c_1}$$

where $$\frac{\partial e^2(t)}{\partial c_1} = 2e(t) \frac{\partial e(t)}{\partial c_1} = -2e(t) \cos(2\pi f t)$$

(ii) (gradient of $<e^2(t)>$ with respect to $$c_2) \simeq \frac{\partial e^2(t)}{\partial c_2}$$

where $$\frac{\partial e^2(t)}{\partial c_2} = 2e(t) \frac{\partial e(t)}{\partial c_2} = -2e(t) \sin(2\pi f t).$$

The gradient points in the direction of "increase" of $<e^2(t)>$ so that the LMS algorithm is written:

$$c_1(K+1) = c_1(K) + 2\mu e(t_k)\cos(2\pi f t_k)$$

$$c_2(K+1) = c_2(K) + 2\mu e(t_k)\sin(2\pi f t_k)$$

where

K—represents a time index of independent points in time, and $\mu$—represents a parameter which controls filter stability and convergence speed.

Figure 1:
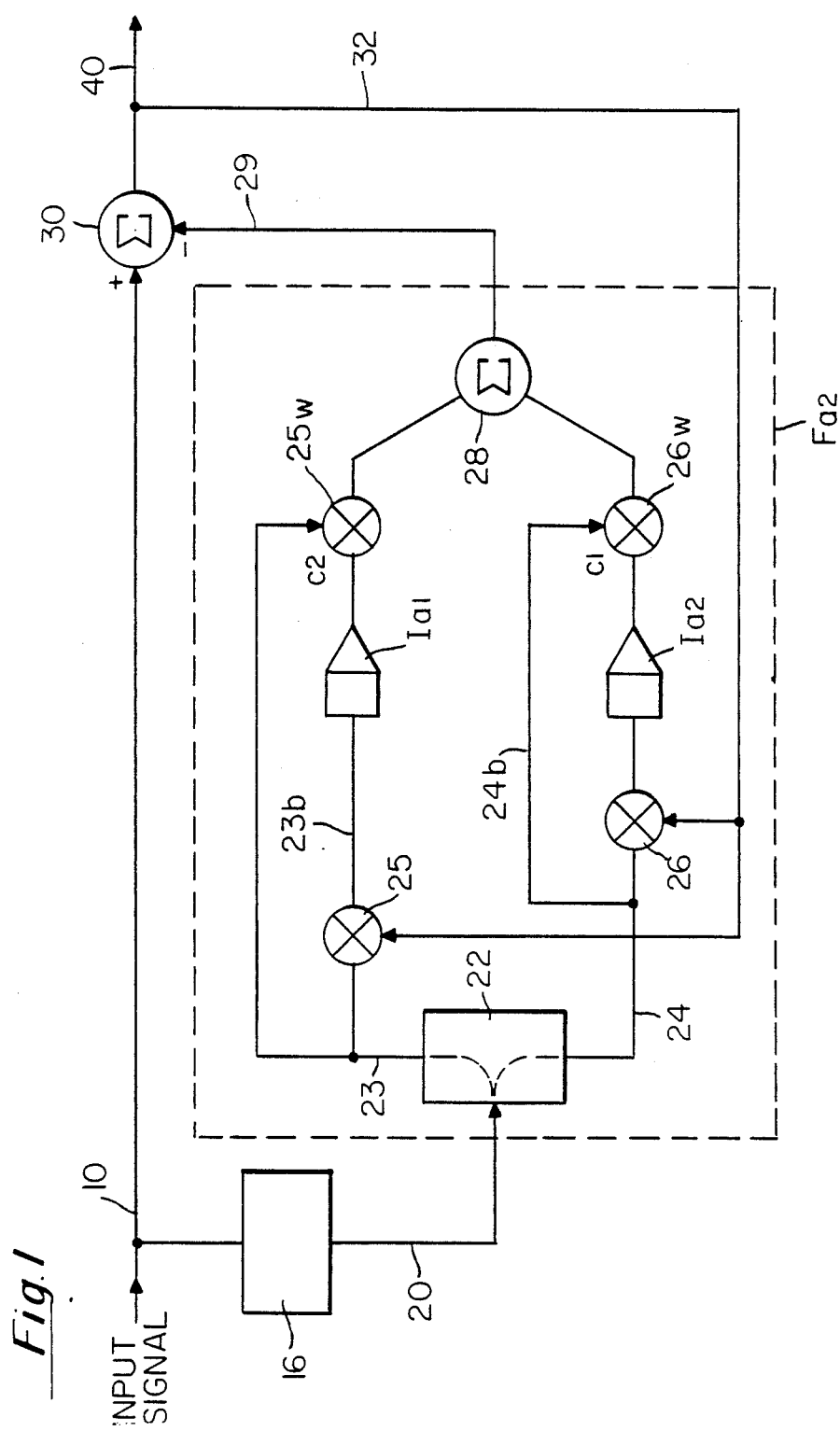
FIG. 1 is a schematic drawing of the phase/frequency-lock loop driven single tone canceller.

Thus, by multiplying the error signal $e(t)$ by each tap signal ($\cos 2\pi f t$ or $\sin 2\pi f t$), scaling by $\mu$, and adding this value to the previous weight value to effect an integration, the LMS algorithm is effectuated by the two-weight adaptive filter Fa2 of FIG. 1.

In order to accomplish single tone cancellation in the FIG. 2 embodiment, there are only two weights which are required. Thus multiplier 25 has a filter coefficient designated $c_2$ while multiplier 26 has a filter coefficient designated $c_1$ which establish the weighting factors for the in-phase and quadrature versions of the reference tone.

Thus for single tone cancellation, only the two filter coefficients $c_1$ and $c_2$ are required. The following equation describes the weighting operation, where $y(t)$ is the output of the two-weight canceller:

$$y(t) = c_1\cos(2\pi f t) + c_2\sin(2\pi f t) = A\cos(2\pi f t - \phi) \quad \text{[Eq I]}$$

where
f = the single tone interference frequency $$A = \sqrt{c_1^2 + c_2^2} \text{ (Amplitude)}$$

$$\phi = \tan^{-1}\frac{c_2}{c_1}$$

The filter coefficients $c_1$ and $c_2$ must therefore be adjusted so that the amplitude A and the phase $\phi$ "match" that of the interference occurring in the input signal, $d(t)$.

In order to eliminate the multitudinous number of components required by the prior art, the circuitry of the preferred embodiment is shown in FIG. 1. The input line 10 is fed to a summer 30 and to a phase/frequency-lock loop 16. The output of the loop on line 20 is fed to the quadrature power divider 22 which separates the in-phase and quadrature tones on the two lines respectively designated 23 and 24.

The in-phase tone on line 23 is multiplied by the error signal at multiplier 25, the output of which is integrated by integrator $I_{a1}$. The output of the integrator is the in-phase weighting coefficient $c_2$, which weights the in-phase tone at multiplier $25_w$, whose output is fed to the summer 28.

The quadrature tone on line 24 is multiplied by the error signal at multiplier 26, the output of which is integrated by integrator $I_{a2}$. The integrator output is the quadrature weighting coefficient $c_1$, which weights the quadrature tone at multiplier $26_w$, whose output is fed to the summer 28. The output of summer 28 is then fed on line 29 to the final output summer circuit 30. An output feedback line 32 from summer circuit 30 provides the error signal to the multipliers 25 and 26.

In FIG. 1, the final output line 40 presents the wideband signal free of any interfering single tone interference signals.

In FIG. 1 of the preferred embodiment, the number of components is now found to be four multipliers, two integrators plus two summer circuits, in addition to a quadrature power divider and the phase/frequency-lock loop circuit.

In the digital implementation, the two input summers can be placed on one chip while the quadrature power divider can occupy one chip and the phase/frequency-lock loop will occupy two chips. Thus there is an extensive saving in components and chips involved, over the circuitry of FIG. 3.

In the LMS algorithm, weight generation is accomplished by multiplying the "tap" signals (generated by sampling the in-phase and quadrature phase reference tones in the digital version) by the error control signal and then integrating, or accumulating, the result. Effectively this process constitutes a correlation procedure.

If the single tone interference has not yet been completely cancelled from the input signal, then one or both of the products in equation I will yield a non-zero DC component, which is then accumulated, thereby changing the value of the respective weights involved.

The least mean square (LMS) algorithm is thus a negative feedback algorithm which optimizes the correlation between the error value and the tap values. Assuming that a noise-free reference is provided, the weights are therefore adjusted so that the single tone interference (which is correlated with the reference tone) is completely cancelled from the input signal.

The LMS algorithm adaptive filter always operates to minimize the mean square error (MSE). In the case of a noise-free reference, the filter can accomplish a perfect nulling of the single tone interferer. However, if the reference is noisy, then the filter must compromise between the noise power and the single tone interference power left in the error signal.

Thus, in order for optimum performance to occur, the reference signal must be free of noise components.

In the situation where the single tone canceller is an all-digital filter, and if all of the computations are completed in one clock cycle, then the LMS algorithm can be implemented without difficulty. However, to achieve high clock rates, the operations may require "pipelining" which introduces time delays into the feedback loop.

The form of the LMS algorithm implies that the same tap values used to generate a particular error signal must also be used to adjust the weight values. In other words, the error signal that resulted from a particular set of tap values must multiply these same tap values in the update process. However, if there are time delays in the feedback loop, then the tap values will have changed by the time the resultant error signal is multiplied by the taps. In the digital implementation, the tap values must therefore be stored by shifting them through a tapped delay line. The error signal is then multiplied by the values at the "end" of the delay line. The number of delays in the delay line corresponds to the number of clock cycle delays in the feedback loop.

In the digital/analog implementation, part of the feedback loop is composed of analog components, and thus the feedback delay will not, in general, be equal to an integral number of clock cycles. Thus, the delay compensation procedure described above must be corrected by adjusting the feedback loop delay until it is approximately equal to an integral number of clock cycles. This can be done by simply adding an appropriate analog delay element into the feedback path. The delay compensation procedure for all digital single tone cancellers can then be implemented.

Figure 3:
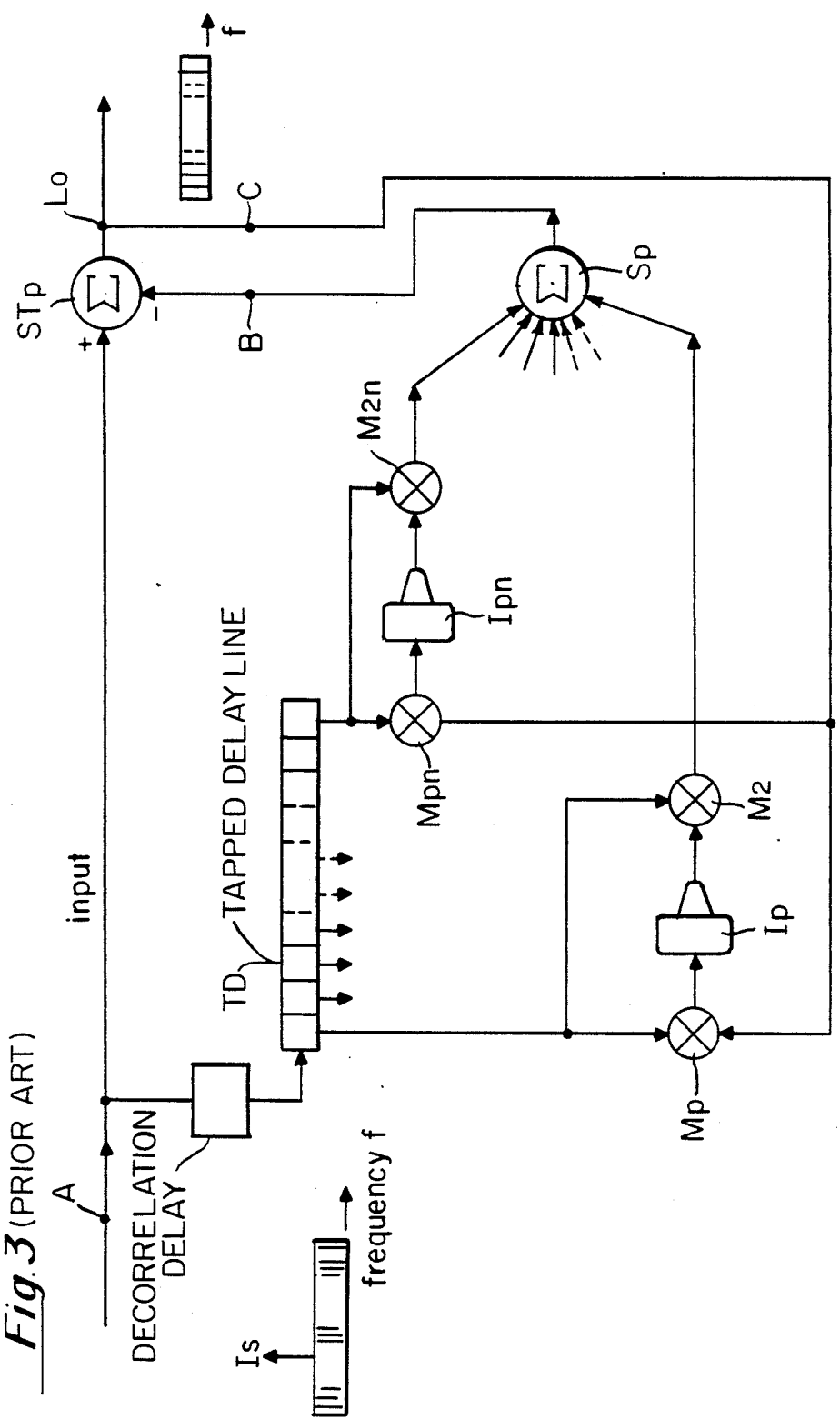
FIG. 3 is a drawing of the type of analog (or digital) transversal adaptive filter used in the prior art.

High Frequency Conditions:

There may be specific applications which require cancellation of tones at frequencies far outside the bandwidth capabilities of the two-weight digital adaptive noise canceller such as described in FIGS. 1, 2, and 3. For such cases, a portion of the high frequency input signal band may be "down-converted" to a "baseband" range of frequencies for processing. The adaptive filter output is then "up-converted" to the input signal band to cancel the unwanted tone. The resulting error signal must then be "down-converted" to the baseband range for the purpose of weight update as will be illustrated in connection with FIG. 4.

Figure 4:
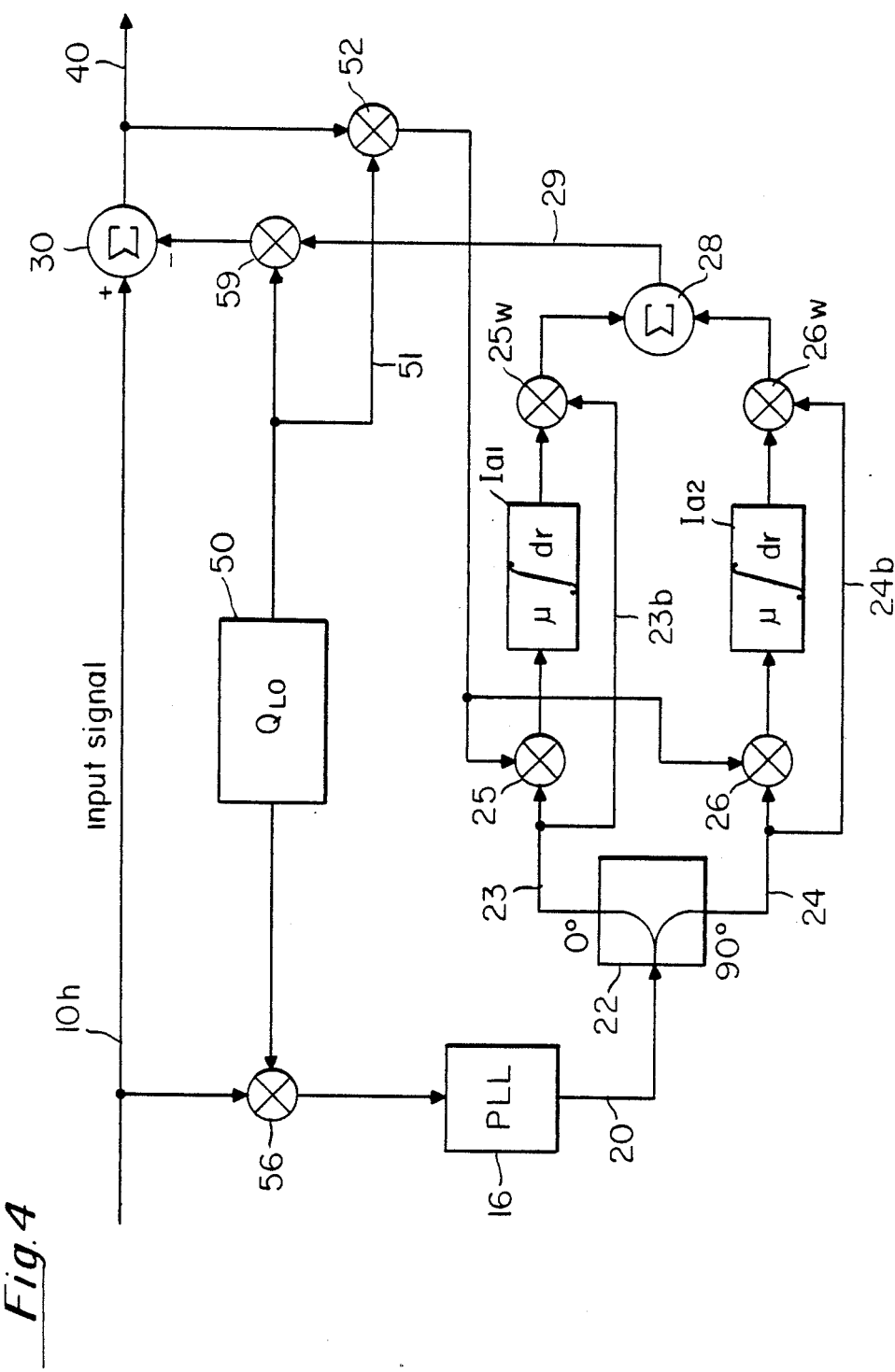
FIG. 4 is a drawing showing how a high frequency input signal band can be translated into a lower level base band, thus extending the range of operation to high frequency bands.

As seen in FIG. 4, the baseband range of frequencies is handled by the adaptive filter starting from the phase/frequency-lock loop 16 and on through to the output line 29 of the summer circuit 28.

The high frequency wideband input signal at $10_h$ is fed to a down-converting multiplier 56 which receives its other input from a local oscillator $0_{Lo}$ 50.

For example, assuming the input signal band (at $10_h$ of FIG. 4) involved a bandwidth of 270 megahertz and a center frequency of 1.70 gigahertz, and included an interference tone of 1.73 gigahertz. Now assuming that the local oscillator was set at 1.70 gigahertz, then the down-converting multiplier 56 would translate the interference tone down to 0.03 gigahertz.

Then, after processing by the adaptive filter of FIG. 4, which also received a feedback error signal on line 32 (after it was down-converted by the multiplier 52), the output of the summer circuit 28 on line 29 would feed the "up-converter" multiplier 59 which then would provide the "subtractive" signal to the final output summer circuit 30. The output of summer 30 is the wideband output signal which, after convergence, is free of the interference tone.

Figure 5:
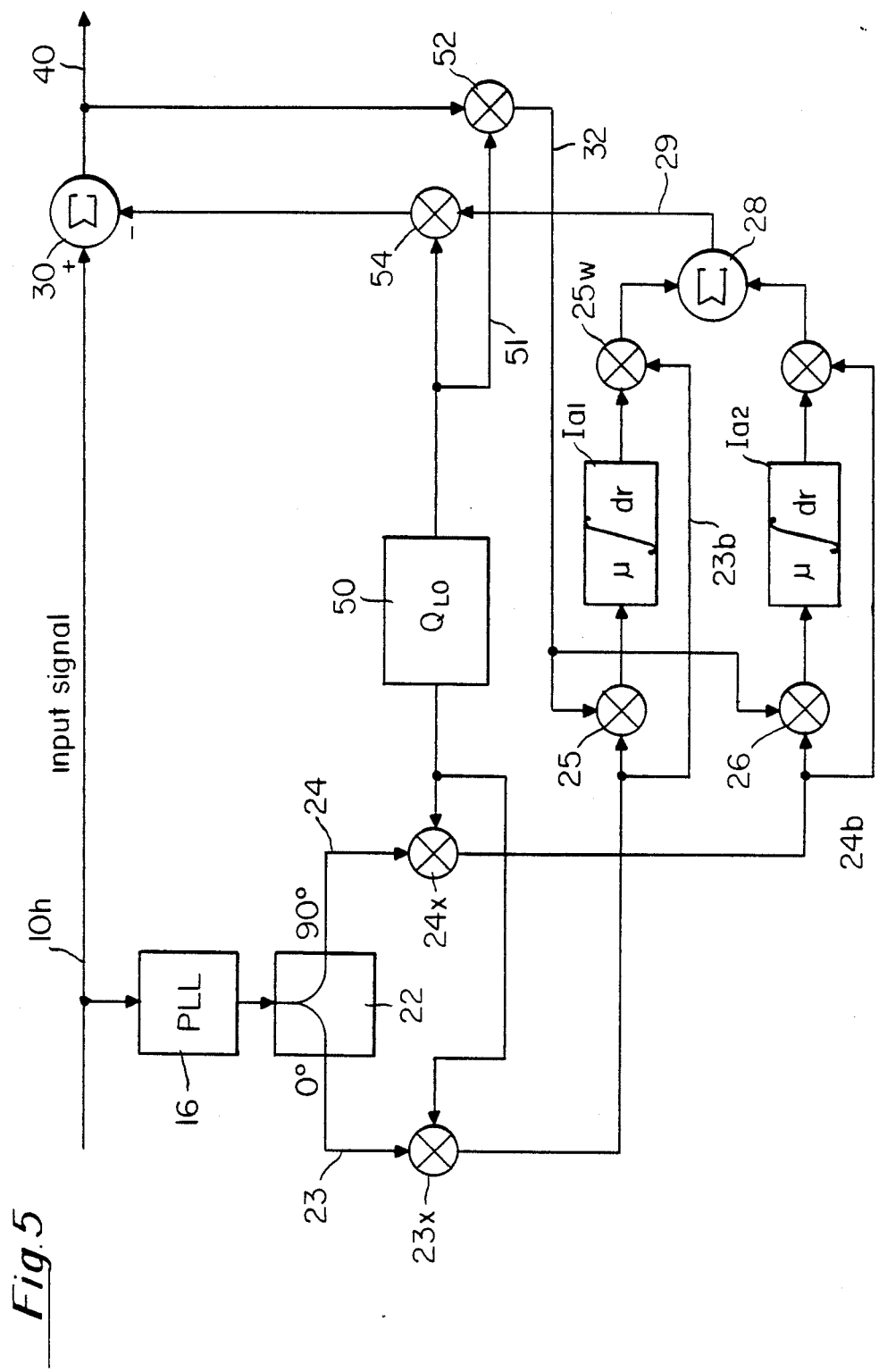
FIG. 5 is a circuit drawing showing another configuration for handling high frequency wave bands.

An alternative circuit is shown in FIG. 5 in which the phase/frequency-lock loop circuitry 16 operates directly on the input signal band $10_h$. Here there are provided two down-converter multipliers $23_x$ and $24_x$ which down-convert both the in-phase tone and the quadrature tone provided by power divider 22. Again, the local oscillator 50 provides inputs to the multipliers $23_x$ and $24_x$. As before, there is a feedback line from the output of the summer circuit 30 which is down-converted by the multiplier 52 and fed on line 32 as feedback to the adaptive filter circuitry. The output of the summer circuit 28 is fed on line 29 to the up-converting multiplier 59 which provides the "subtractive" signal to the final output summer circuit 30, resulting in a clean and clear wideband signal on line 40 which is no longer saddled with the interference tone.

Generally, the width of the spectral band searched by the phase/frequency-lock loop 16 should be less than half the allowable bandwidth of the two-weight filter. Thus the frequency band in which the interfering tone resides should be down-converted to that portion of the two-weight filter operating band which has been accurately delay compensated.

Narrowband Parameter Estimator:

It is often desirable to gain some estimation of the frequency and the relative power of narrowband interference signal sources. This information would be extremely valuable in any system where narrowband interference is a problem. Thus, for example, this information could be used to determine which channels of a channelized receiver should be switched off. It could also be used to assign the operating bands of single tone cancellers and adaptive line enhancers. As will be shown, the phase/frequency lock loop driven single tone canceller, in addition to cancellation of single tone interference, can also be used to estimate the frequency and the relative power of narrowband interference sources.

Figure 6:
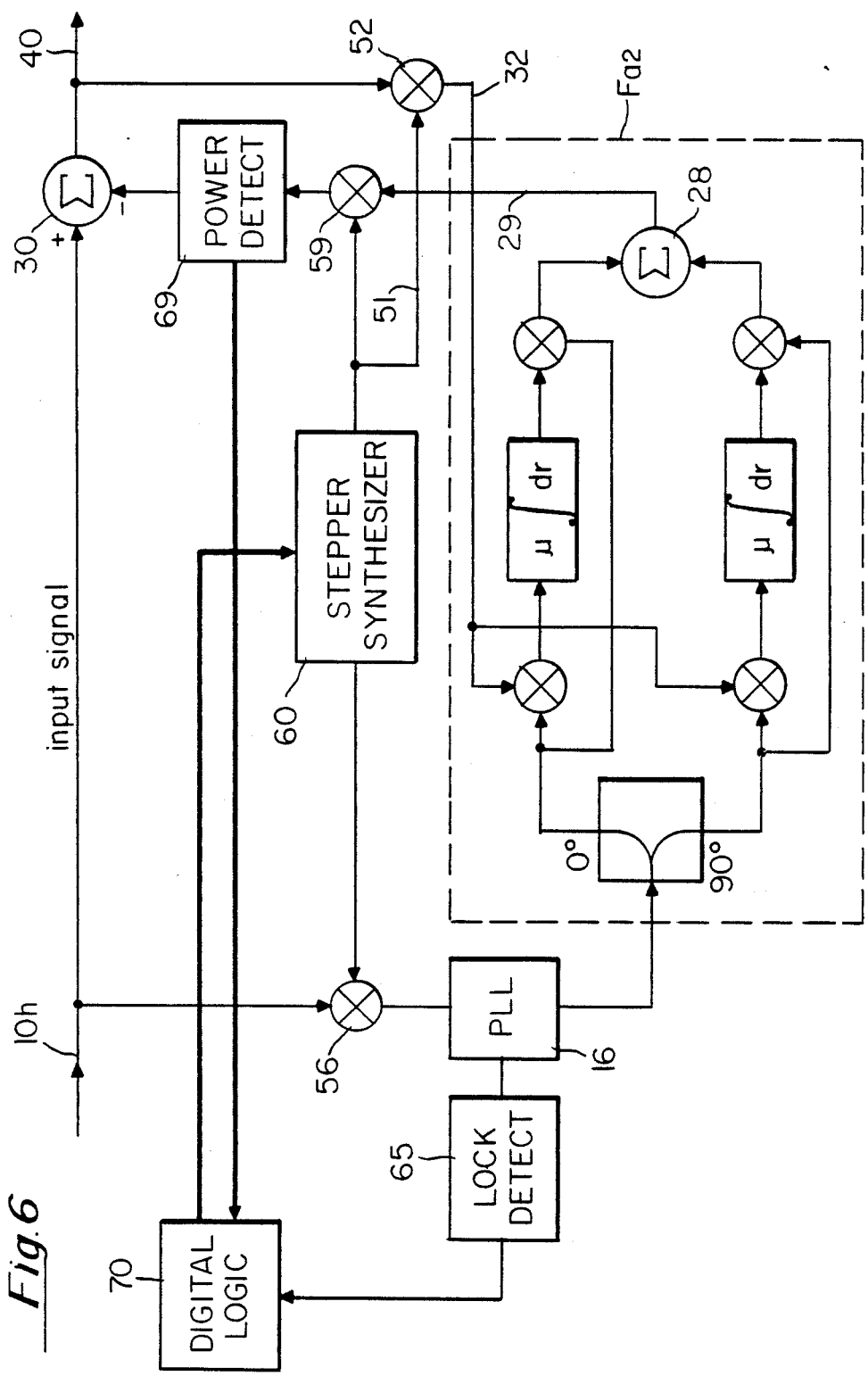
FIG. 6 shows an embodiment of the phase/frequency-lock loop driven single tone canceller used to estimate the frequency and power of narrowband interference sources.

As seen in FIG. 6, a "narrowband parameter estimator" can be realized by replacing the local oscillator 50 in FIG. 3 with a stepped synthesizer 60, which cooperates with a digital logic control unit 70. The step size of synthesizer 60 is approximately equal to the loop bandwidth of the phase/frequency-lock loop, which loop bandwidth would also determine the frequency resolution of the estimator.

The synthesizer frequency is stepped up or down, and pauses at each step long enough for the phase/frequency-lock loop to search the corresponding band. A lock-detect circuit 65 signals the digital logic 70 when the phase/frequency-lock loop circuit 16 locks onto a signal. The phase/frequency-lock loop circuit 16 is fed from the output of multiplier 56 which functions as a down-converter of the wideband input signal $10_h$.

If lock is detected, a sufficient period of time is then allowed for the two-weight canceller to converge, —that is to say, to replicate the down-converted interference signal. Once convergence has been achieved, then a power measurement of the two-weight canceller output on line 29 is made by the power detection circuit 69.

The error signal is provided on feedback line 32 after having been down-converted by the multiplier 52. The output of the summer circuit 28 is fed on line 29 to the up-converting multiplier 59, the output of which is fed to the power detect circuit 69, which then provides the subtracting or cancelling signal to the final output summer circuit 30.

Thus, both the frequency and the relative power of various narrowband interferers in a wideband system can be automatically determined and recorded. This is accomplished through the use of the digital logic circuit 70 which is informed by the lock detection circuitry 65 that a lock has occurred. The digital logic can then record the power value from the power detect circuit 69 after the adaptive filter has been allowed time to converge.

Likewise, in the arrangement of FIG. 6, the adaptive filter will also cancel the interference signal which is embedded in the wideband input signal at $10_h$ so that the output signal at line 40 will be a clean and clear wideband signal devoid of the interference.

There has been described herein a method and implementation circuitry for estimating the frequency and power of narrowband interference signal sources which debauch the clarity of a wideband data transmission signal. Thus, with the use of a basic phase/frequency-lock loop driven single tone canceller combined with the stepped synthesizer, up-down multipliers, and further combined with a lock detect, a power detect and a digital logic circuit, there is realized a method and circuit for the detection of narrowband interference signals which may degrade a wideband signal transmission. Additionally, the circuitry can be used to nullify or cancel out the narrowband interference tones which degrade the wideband signal and thus permit a clean reception of the wideband signal.

While the above-described concept and embodiment has been shown in its preferred architecture and arrangement, it is possible that other forms of implementation may be used to accomplish the task while still falling within the scope of the above described concepts as delineated in the following claims.

What is claimed is:

1. A method for searching a wideband input signal for narrowband interference tones, and for estimating their frequency and relative power, wherein a single tone adaptive noise canceller is used in conjunction with a phase/frequency-lock loop circuit and a digital logic unit, comprising the steps of:
    (a) receiving a desired wideband signal corrupted by unwanted interference tones;
    (b) stepping a synthesizer circuit with said digital logic unit until said phase/frequency-lock loop locks onto an interference tone;
    (c) detecting the lock and sending a lock-detect signal to said digital logic unit;
    (d) weighting and summing the in-phase and quadrature phase versions of a phase/frequency-lock loop voltage controlled oscillator (VCO) output tone with a two-weight adaptive filter, so as to match the phase and amplitude of said interference tone;
    (e) taking a power measurement of the said matched tone at the output of said two-weight adaptive filter;
    (f) sending said power measurement to said digital logic unit for storage;
    (g) storing the current frequency setting on said synthesizer circuit.

2. The method of claim 1 which includes the steps of:
    (a) down-converting a portion of said wideband input signal to a frequency band that resides in the capture range of said phase/frequency-lock loop;
    (b) down-converting the in-phase and quadrature phase versions of the phase/frequency-lock loop VCO output tone to the baseband range of said two-weight adaptive filter;
    (c) down-converting an error feedback signal, from a final output summation circuit to said baseband frequency range for providing a weight-update signal to said adaptive filter;
    (d) up-converting the output of said adaptive filter to the input frequency band, to provide an up-converted signal;
    (e) subtracting said up-converted signal from said wideband input signal to develop said error feedback signal.

3. Apparatus for recording the frequency of the sub-bands of a wideband input signal in which resides a narrowband interference tone comprising:
    (a) means for receiving said wideband input signal and its accompanying interference tones;
    (b) means for stepping the frequency of a synthesizer through said wideband input signal to locate sub-bands in which interference tones reside;
    (c) phase/frequency-lock loop means for locking onto an interference tone residing in one of said sub-bands;
    (d) said phase/frequency-lock loop means including a voltage controlled oscillator (VCO) which provides a reference tone that is phase related to said interference tone once lock is achieved;
    (e) two-weight adaptive filter means for adjusting phase and amplitude of said reference tone to match the phase and amplitude of said interference tone;

(f) means for nullifying said interference tone by subtracting said matched tone from the said input signal;

(g) means for conveying the resulting "difference" signal to said adaptive filter as an error feedback control signal for weight update.

4. The apparatus of claim 3 wherein said means for searching includes:

(a) said digital logic means for timely stepping and holding, temporarily, said synthesizer frequency when an interference tone is sensed;

(b) sensing means for signaling said digital logic means when said means for locking is locked onto an interference tone.

5. The apparatus of claim 3 wherein said two-weight adaptive filter includes:

(a) means for weighting and summing the in-phase and quadrature phase versions of said VCO-generated reference tone to develop said matched tone.

6. The apparatus of claim 3 wherein said means for receiving a wideband input signal includes:

(a) final output summation circuit means for subtracting said matched tone from said input signal.

7. The apparatus of claim 4 wherein said means for locking includes:

(a) sensing means for detecting when the phase/frequency-lock loop is locked onto a narrowband interference tone, and means for signaling said digital logic means that a lock has been effectuated.

8. The apparatus of claim 5 wherein said means for generating a reference tone includes:

(a) said phase/frequency-lock loop circuit for locking onto said narrowband interference tone, including said voltage controlled oscillator which generates said reference tone.

9. The apparatus of claim 5 which includes:

(a) quadrature power divider means for developing said in-phase and quadrature phase versions of said reference tone;

(b) means for multiplying said in-phase and quadrature tones with said feedback signals;

(c) integrator circuitry to provide filter coefficient values which weight said in-phase and quadrature phase tones to permit summing of the weighted tones to generate said matched tone.

10. The apparatus of claim 3 including:

(a) means for down-converting said wideband input signal to a frequency band compatible with said means for generating a reference tone, and matching to said interference tone;

(b) means for up-converting said matched tone from said compatible frequency band to the original input frequency band.

* * * * *